United States Patent
Tang et al.

(10) Patent No.: US 12,426,240 B2
(45) Date of Patent: Sep. 23, 2025

(54) SEMICONDUCTOR STRUCTURE WITH A PLURALITY OF CONNECTION LINES

(71) Applicant: CHANGXIN MEMORY TECHNOLOGIES, INC., Hefei (CN)

(72) Inventors: Yi Tang, Hefei (CN); Jianfeng Xiao, Hefei (CN); Xiaojie Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 534 days.

(21) Appl. No.: 17/946,019

(22) Filed: Sep. 15, 2022

(65) Prior Publication Data

US 2023/0012587 A1    Jan. 19, 2023

(30) Foreign Application Priority Data

Jun. 15, 2022  (CN) .......................... 202210680171.8

(51) Int. Cl.
*H10B 12/00*  (2023.01)
*H10B 51/30*  (2023.01)
*H10B 53/30*  (2023.01)

(52) U.S. Cl.
CPC ............. *H10B 12/30* (2023.02); *H10B 12/48* (2023.02); *H10B 12/482* (2023.02); *H10B 12/485* (2023.02); *H10B 51/30* (2023.02); *H10B 53/30* (2023.02)

(58) Field of Classification Search
CPC ...... H10B 12/30; H10B 12/48; H10B 12/482; H10B 12/485; H10B 51/20; H10B 51/30; H10B 53/20; H10B 53/30
See application file for complete search history.

(56) References Cited

U.S. PATENT DOCUMENTS

| | | | | |
|---|---|---|---|---|
| 6,262,450 B1 * | 7/2001 | Kotecki | ................... | H10D 1/68 |
| | | | | 257/305 |
| 2022/0271048 A1 * | 8/2022 | Lin | ........................ | H10B 51/20 |
| 2023/0380145 A1 * | 11/2023 | Chen | .................... | H10B 12/488 |
| 2024/0389306 A1 * | 11/2024 | Wang | ..................... | H10B 12/30 |

FOREIGN PATENT DOCUMENTS

| | | | | |
|---|---|---|---|---|
| CN | 110164867 A | | 8/2019 | |
| CN | 111406287 A | * | 7/2020 | ......... G11C 11/5628 |
| DE | 102019124668 A1 | * | 6/2020 | ........... G06F 3/0616 |
| WO | WO-2014036461 A1 | * | 3/2014 | ......... H01L 27/0688 |
| WO | WO-2023060794 A1 | * | 4/2023 | ............. H10B 12/03 |

* cited by examiner

*Primary Examiner* — Matthew E Warren
(74) *Attorney, Agent, or Firm* — Kilpatrick Townsend & Stockton LLP

(57) ABSTRACT

Embodiments relate to the field of semiconductors, and provide a semiconductor structure, including a substrate and connection lines. Structural cells arranged in an array are provided on the substrate, and include transistor groups arranged in a first direction, and the transistor groups include multi-layer transistors extending in a second direction. The first direction is perpendicular to the second direction, and both are parallel to a surface of the substrate. The structural cells further include bit lines extending in a third direction, the bit lines are electrically connected to the multi-layer transistors in the same transistor group, where the third direction is perpendicular to the surface of the substrate. The connection lines are connected to the bit lines in the structural cells in one-to-one correspondence, and one bit line in the structural cells arranged in the array is connected to the same connection line.

15 Claims, 6 Drawing Sheets

SEMICONDUCTOR STRUCTURE WITH A PLURALITY OF CONNECTION LINES

CROSS-REFERENCE TO RELATED APPLICATION

This application claims priority to Chinese Patent Application No. 202210680171.8, titled "SEMICONDUCTOR STRUCTURE" and filed to the State Patent Intellectual Property Office on Jun. 15, 2022, the entire contents of which are incorporated herein by reference.

TECHNICAL FIELD

The present disclosure relates to the field of semiconductors, and more particularly, to a semiconductor structure.

BACKGROUND

As a kind of semiconductor memory, a dynamic random access memory (DRAM) mainly functions to represent whether a binary bit stored therein is 1 or 0 based on quantity of electric charge stored in a capacitor.

As a structure where multi-layer transistors are stacked on a substrate, a three-dimensional (3D) stacked DRAM has a higher integration level, which is advantageous to reducing costs per unit area. However, there are few transistors and capacitors corresponding to a bit line in the 3D stacked DRAM.

SUMMARY

Embodiments of the present disclosure provide a semiconductor structure.

According to some embodiments of the present disclosure, one aspect of the embodiments of the present disclosure provides a semiconductor structure, which includes a substrate and a plurality of connection lines. Structural cells arranged in an array are provided on the substrate, and the structural cells include a plurality of transistor groups arranged in a first direction, where the plurality of transistor groups include multi-layer transistors extending in a second direction. The first direction is perpendicular to the second direction, and both the first direction and the second direction are parallel to a surface of the substrate. The structural cells further include a plurality of bit lines extending in a third direction, and the plurality of bit lines are electrically connected to the multi-layer transistors in the same transistor group, where the third direction is perpendicular to the surface of the substrate. The plurality of connection lines are connected to the plurality of bit lines in the structural cells in one-to-one correspondence, and one of the bit lines in the structural cells arranged in the array is connected to the same connection line.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Figure 1:
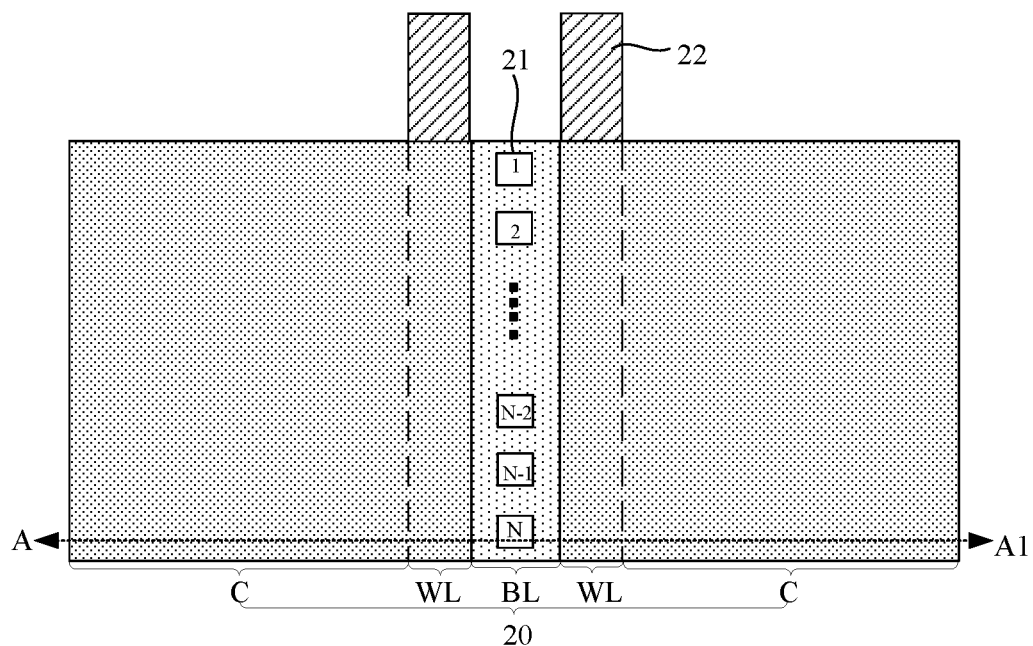
FIG. 1 shows a vertical view of a structural cell provided by an embodiment of the present disclosure.

As can be known from the background art, there are more connection lines in a three-dimensional (3D) stacked dynamic random access memory (DRAM), such that complexity of a process is increased. Based on analysis, it is found that a main reason is as follows: in a structure of the 3D stacked DRAM, number of transistors and capacitors corresponding to a bit line mainly depends on number of stacked layers of the transistors and the capacitors. However, due to process limitations, it is difficult to increase the number of the stacked layers. In addition, a plurality of structural cells are generally provided in the 3D stacked DRAM, each structural cell has a plurality of bit lines, and the bit lines need to be connected to a peripheral circuit via the connection lines. Because there are more connection lines, the complexity of the process for connecting the connection lines to the peripheral circuit is increased.

Embodiments of the present disclosure provide a semiconductor structure, which includes a plurality of connection lines connected to the plurality of the bit lines in the structural cells in one-to-one correspondence, and one of the bit lines in the structural cells arranged in an array is connected to the same connection line. That is, one connection line may connect the bit lines in a plurality of structural cells, and the interconnected bit lines may be regarded as the same bit line, thereby increasing the number of the transistors and the capacitors connected to one bit line. In addition, because each bit line does not need to be led out via a single connection line, number of the connection lines is reduced, thereby simplifying the process for connecting the connection lines to the peripheral circuit.

The embodiments of the present disclosure will be described in detail below in conjunction with the accompanying drawings. However, a person of ordinary skill in the art may understand that in the embodiments of the present disclosure, many technical details are put forward such that a reader may better understand the embodiments of the present disclosure. However, the technical solutions requested to be protected by the embodiments of the present disclosure may also be implemented even without these technical details or various variations and modifications based on the following embodiments.

As shown in FIGS. 1 to 9, an embodiment of the present disclosure provides a semiconductor structure. First of all, it should be noted that the semiconductor structure has a first direction X, a second direction Y and a third direction Z, where the first direction X is an arrangement direction of a plurality of transistor groups, and the second direction Y is an extension direction of transistors 23, the first direction X is perpendicular to the second direction Y, and both the first direction X and the second direction Y are parallel to a surface of a substrate 10. The third direction Z is a stacking direction of the multilayer transistors 23, and the third direction Z is perpendicular to the surface of the substrate 10.

The semiconductor structure includes: the substrate 10 and a plurality of connection lines 30. Structural cells 20 arranged in an array are provided on the substrate 10, and the structural cells 20 include a plurality of transistor groups arranged in the first direction X, where the transistor groups include the multi-layer transistors 23 extending in the second direction Y. The first direction X is perpendicular to the second direction Y, and both the first direction X and the second direction Y are parallel to the surface of the substrate 10. The structural cells 20 further include a plurality of bit lines 21 extending in the third direction Z, and the bit lines 21 are electrically connected to the multi-layer transistors 23 in the same transistor group, where the third direction Z is perpendicular to the surface of the substrate 10. The plurality of connection lines 30 are connected to the plurality of bit lines 21 in the structural cells 20 in one-to-one correspondence, and one of the bit lines 21 in the structural cells 20 arranged in the array is connected to the same connection line 30.

That is, the bit lines 21 of different structural cells 20 may be connected to the same connection line 30. Because the interconnected bit lines 21 have a same electrical potential, these bit lines 21 may be regarded as the same bit line 21, and correspondingly, the number of the transistors 23 and capacitors 24 connected to a bit line 21 is increased. In addition, because the plurality of bit lines 21 may be led out via the same connection line 30, and a bit line 21 does not need to be led out via a single connection line 30, such that the number of the connection lines 30 is reduced. With the decrease of the number of the connection lines 30, connection contacts between the connection lines 30 and the peripheral circuit may be reduced, thereby simplifying a process for forming the connection contacts, and reducing a size of the semiconductor structure.

The embodiments of the present disclosure will be described in detail below with reference to the accompanying drawings.

Figure 2:
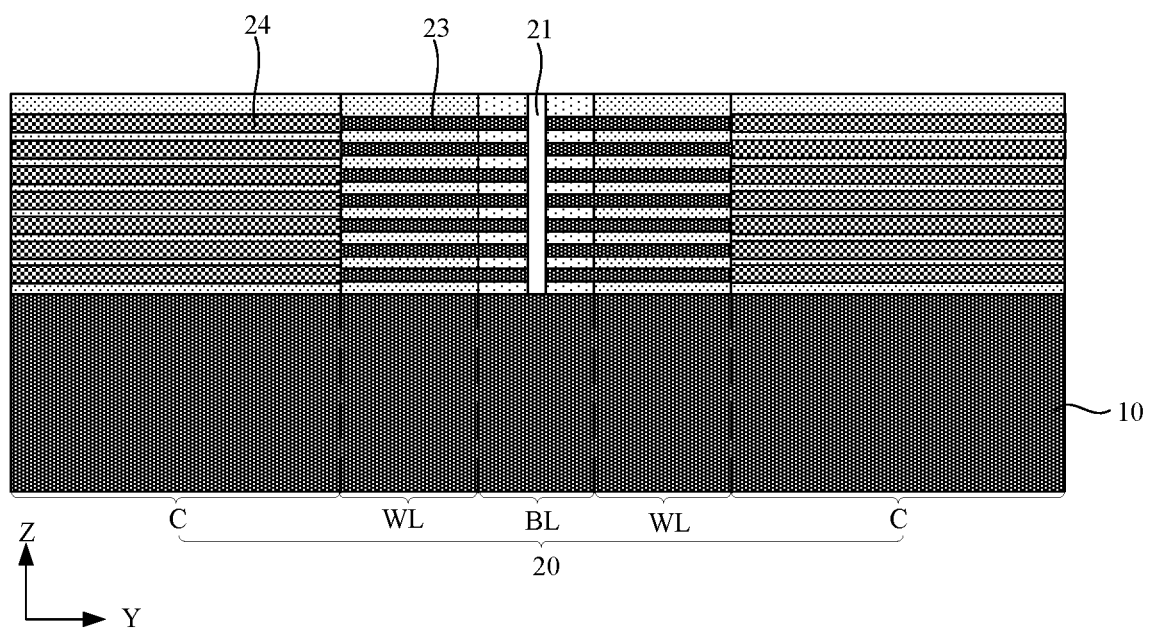
FIG. 2 shows a sectional view of FIG. 1 in a direction A-A1.

FIG. 1 shows a vertical view of the structural cell 20, FIG. 2 shows a sectional view of FIG. 1 in a direction A-A1, and FIG. 2 shows one transistor group in the structural cell 20. Referring to FIG. 1 and FIG. 2, the structural cell 20 may include a transistor 23 region and a capacitor region C arranged in the second direction Y, where the transistor region includes a word line region WL and a bit line region BL. The word line region WL is provided with a plurality of word lines (not shown in the figure) arranged at intervals, and the word lines are connected to the transistors 23 on the same layer. That is, an extension direction of the word lines is the first direction X. The bit lines 21 are positioned in the bit line region BL, and extend in the third direction Y. The capacitor region C has a plurality of capacitors 24, where the capacitors 24 and the transistors 23 are arranged in one-to-one correspondence. In some embodiments, the transistor 23 includes a first source-drain, a channel region and a second source-drain arranged in the second direction Y, where the first source-drain is electrically connected to the capacitor 24, the channel region is electrically connected to the word lines, and the second source-drain is electrically connected to the bit lines 21.

Referring to FIG. 1, the structural cell 20 may further include a word line step 22, and the word line step 22 directly faces the word line region WL. The word line step 22 may lead out a word line. That is, the word line originally extends in the first direction X. To facilitate subsequent connection with the peripheral circuit, the word line step 22 may lead the word line out from the third direction Z.

With continued reference to FIG. 1, the bit lines 21 of the structural cell 20 include first to $N^{th}$ bit lines sequentially arranged in the first direction X, where N is a positive integer greater than 1. For example, the bit lines 21 of all the structural cells 20 are arranged in the same manner.

Referring to FIG. 2, number of a layer of the transistors 23 in the transistor group is two, and the two transistors 23 are respectively connected to two capacitors 24. The two transistors 23 are connected to the same bit line 21, such that the bit line 21 may be connected to more transistors 23 and more capacitors 24. The greater the number of the capacitors 24 is, the better storage capacity of the semiconductor structure is. For example, when number of layers of the transistors 23 is K and number of the structural cells 20 is Q, the number of the capacitors on each connection line 30 is 2KQ. For example, when K=64 and Q=8, the number of the capacitors 24 on each connection line 30 is 1,024. In some other embodiments, number of a layer of the transistors 23 in the transistor group is one.

It should be noted that in the embodiments of the present disclosure, although the bit lines 21 of different structural cells 20 are connected together via the connection lines 30, each structural cell 20 may still work normally, which is described in detail below in conjunction with a working principle of the DRAM.

For the DRAM, a memory cell thereof includes one capacitor 24 and one transistor 23. The capacitor 24 is configured to store charge, and the transistor 23 is configured to access the capacitor 24, and may read how much charge is stored, and may also store new charge. The word line is always connected to a gate of the transistor 23 to control access to the capacitor 24. Connected to a source of the transistor 23, the bit line may read the charge stored in the capacitor 24, or provide a voltage when a new value is written into the capacitor 24. The word line and the bit line 21 are intersected with each other, and there exists one memory cell at each point of intersection. Although the connection line 30 may connect the plurality of bit lines 21, memory cells corresponding to these bit lines 21 are controlled by different word lines without mutual interference. As a result, the structural cell 20 can still work normally.

It is worth noting that in the embodiments of the present disclosure, the bit lines 21 in the same structural cell 20 are connected to different connection lines 30, so there is still a point of intersection between one bit line 21 and one word line in the structural cell 20. When the connection line 30 connects two bit lines 21 in the same structural cell 20, the two bit lines 21 have the same electrical potential, and thus actually are the same bit line 21, such that there may be a case where a plurality of points of intersection are generated between one bit line 21 and one word line.

In some embodiments, one bit line 21 in all the structural cells 20 may be connected to the same connection line 30. In some other embodiments, one bit line 21 in some structural cells 20 may be connected to the same connection line 30. It is acceptable as long as the connection line 30 can connect the bit lines 21 of the plurality of structural cells 20.

A connection manner of the connection lines 30 will be described in detail below.

Figure 3:
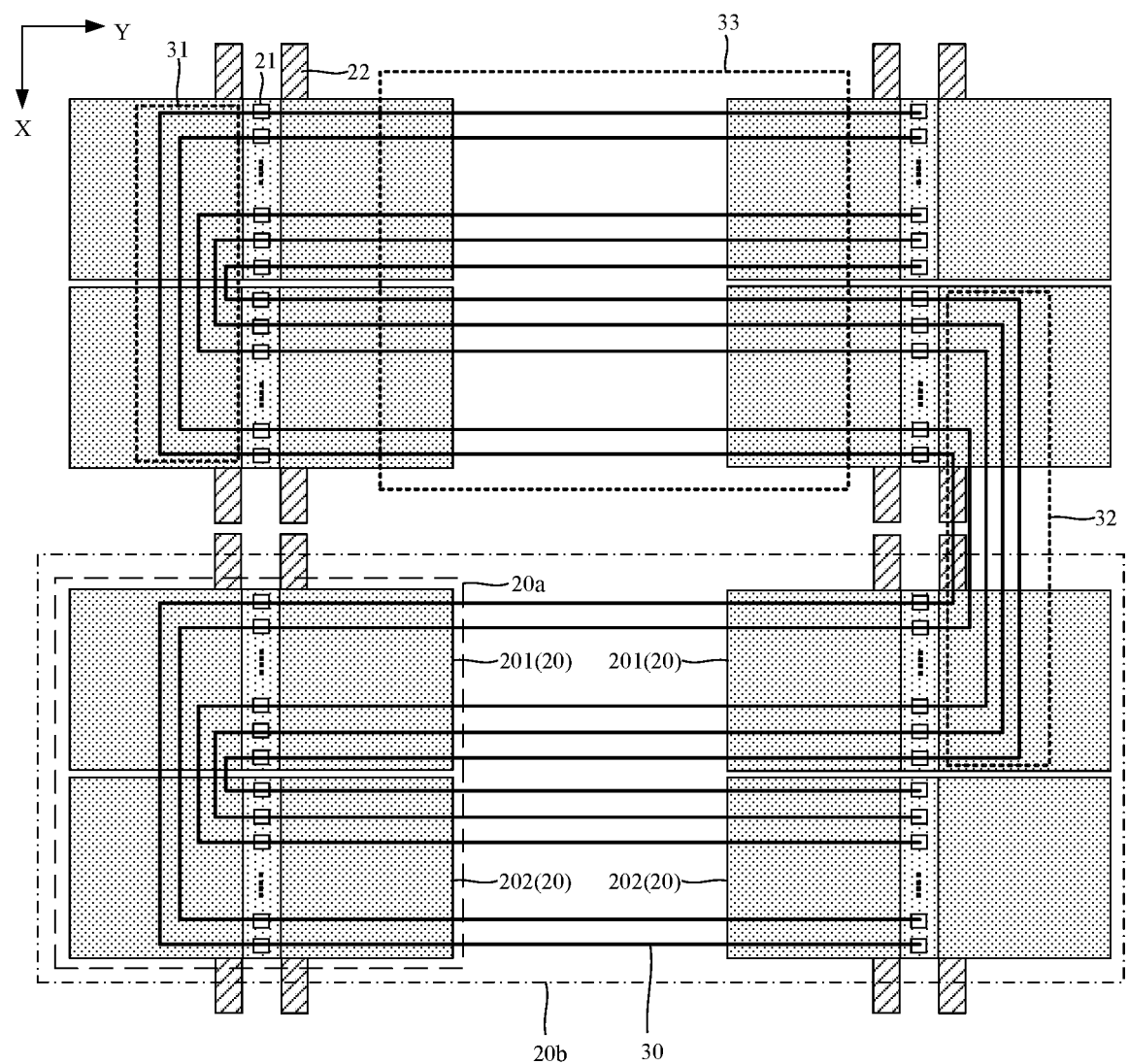
FIG. 3 shows a vertical view of a semiconductor structure provided by an embodiment of the present disclosure.
Figure 4:
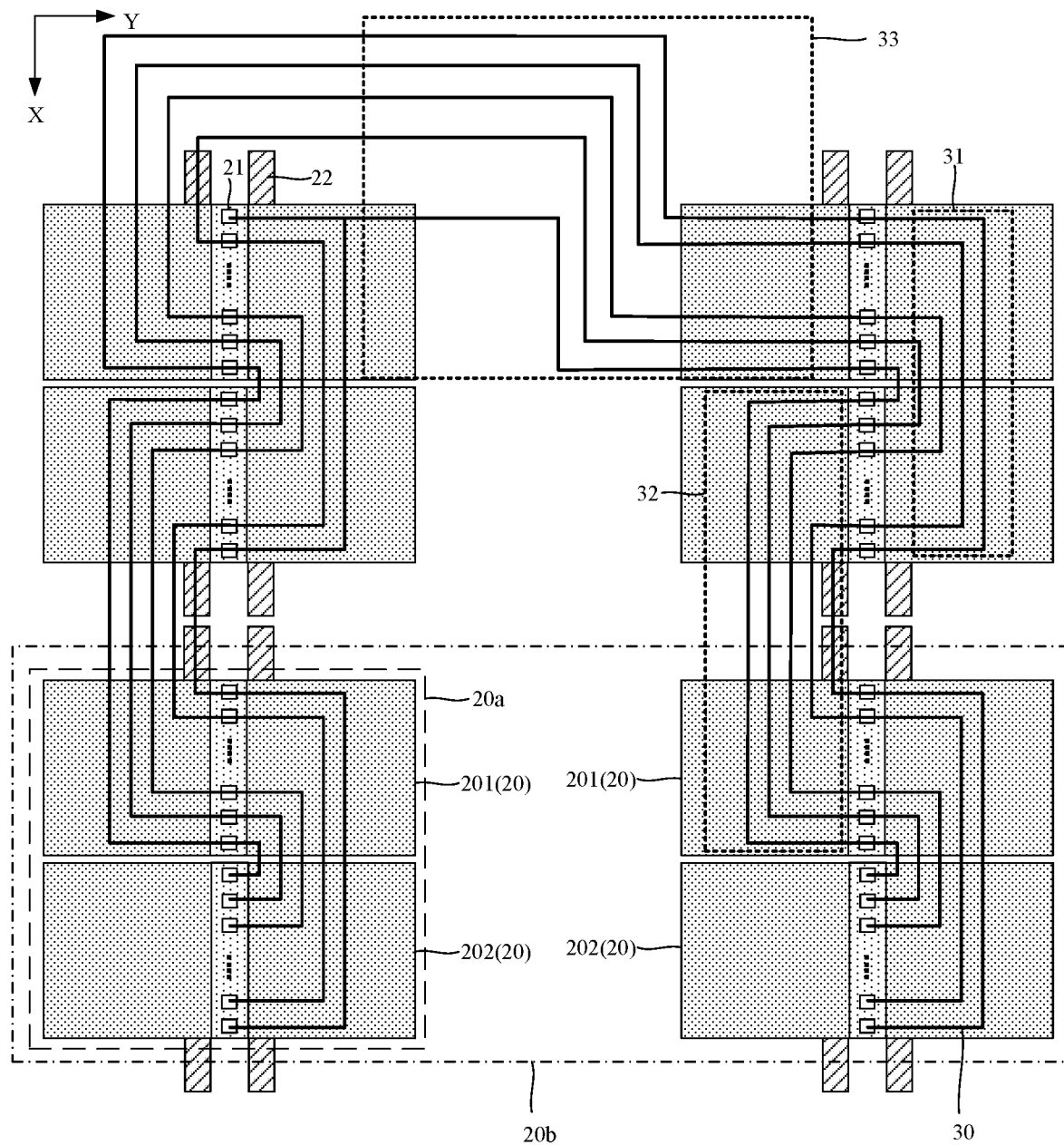
FIG. 4 shows a vertical view of another semiconductor structure provided by an embodiment of the present disclosure.
Figure 5:
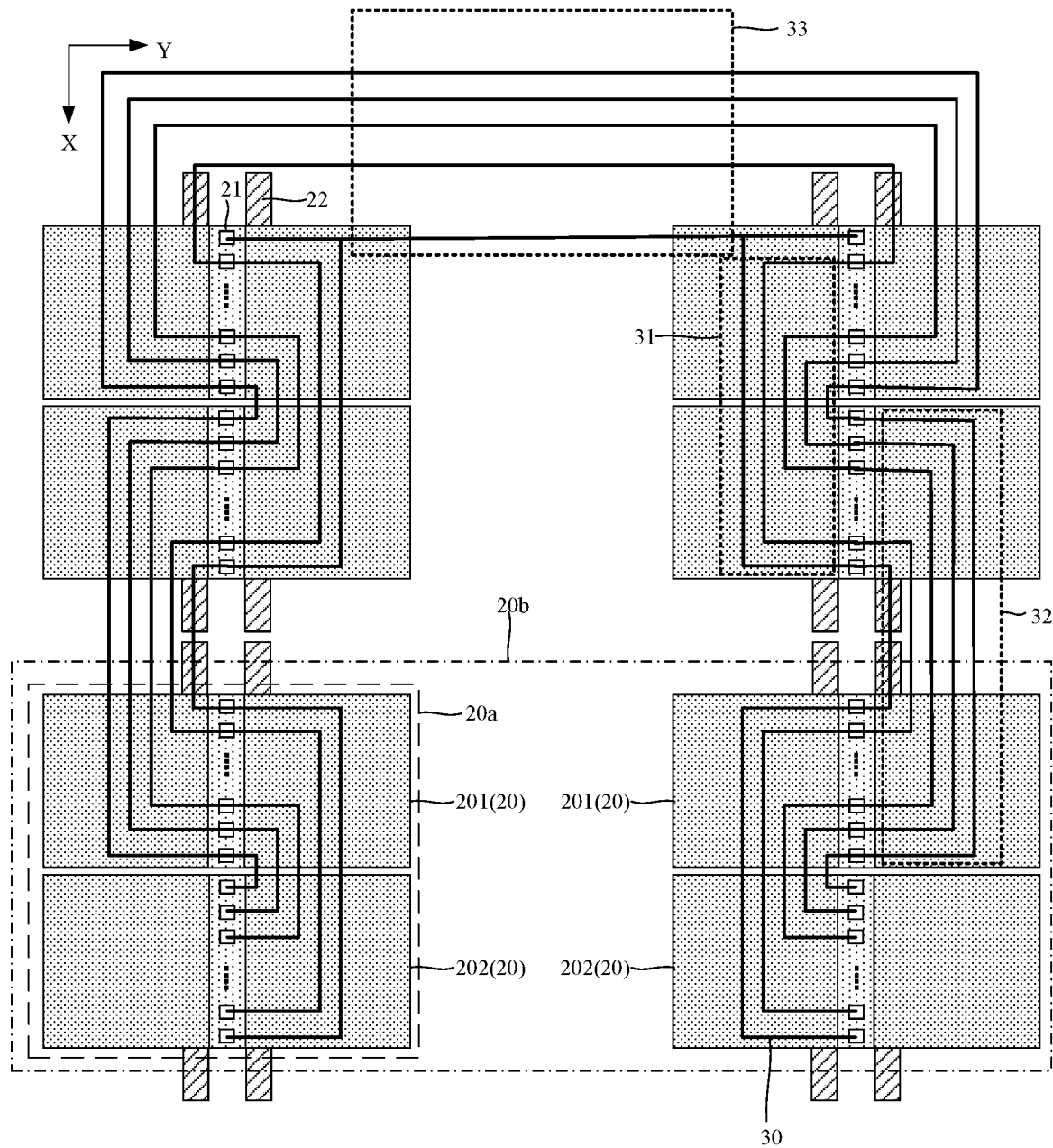
FIG. 5 shows a vertical view of yet another semiconductor structure provided by an embodiment of the present disclosure.

Referring to FIGS. 3 to 5, two adjacent structural cells 20 arranged in the first direction X are configured to constitute a structural circuit 20a. For example, two structural cells 20 of the same structural circuit 20a are a first structural cell 201 and a second structural cell 202, respectively. Two word line steps 22 in the same structural circuit 20a are disposed backwards. That is, the word line step 22 of the first structural cell 201 is positioned on a side of the first structural cell 201 away from the second structural cell 202, and the word line step 22 of the second structural cell 202 is positioned on a side of the second structural cell 202 away from the first structural cell 201.

Two structural circuits 20a arranged in the second direction Y constitute a circuit group 20b; and a plurality of circuit groups 20b are arranged in the first direction X. FIGS. 3 to 5 show two circuit groups 20b.

In some embodiments, two first structural cells 201 in the circuit group 20b directly face each other in the second direction Y, and two second structural cells 202 in the circuit group 20b directly face each other in the second direction Y. That is, arrangement manners of the first structural cells 201 and the second structural cells 202 in different structural circuits 20a are the same.

With continued reference to FIGS. 3 to 5, the connection lines 30 include first connection segments 31, the first connection segment 31 connects two bit lines 21, and the two bit lines 21 are respectively positioned in the two structural cells 20 of the same structural circuit 20a, where sum of serial numbers of the two bit lines 21 is N+1.

That is, the first bit line 21 of one structural circuit 20a is connected to a last bit line 21 of another structural circuit 20a; and a second bit line 21 of one structural circuit 20a is connected to a second last bit line 21 of another structural circuit 20a. By analogy, detailed descriptions are omitted here. Correspondingly, in the same structural circuit 20a, the two bit lines 21 connected to different first connection segments 31 have different spacings. For example, a spacing between the first bit line of the first structural cell 201 and the $N^{th}$ bit line of the second structural cell 202 is maximal; and a spacing between the $N^{th}$ bit line of the first structural cell 201 and the first bit line of the second structural cell 202 is minimal.

An objective of the aforementioned arrangement manner of the first connection segments 31 is to avoid intersection of the first connection segments 31 of the same structural cell 20, thereby avoiding electrical connection between the plurality of first connection segments 31. In addition, connecting the bit lines 21 according to a corresponding relationship between serial numbers is beneficial to standardize a positional relationship between the plurality of first connection segments 31, thereby shortening lengths of the first connection segments 31.

In some other embodiments, sum of the serial numbers of the two bit lines 21 connected to the first connection segment 31 may not be N+1. Correspondingly, different first connection segments 31 may be arranged at different height positions to avoid the electrical connection between the first connection segments 31.

It should be noted that the embodiments of the present disclosure adopt the serial numbers from 1 to N for the bit lines 21 to facilitate understanding. However, the embodiments of the present disclosure do not limit numerical values of the serial numbers of the bit lines 21, as long as corresponding positional relationships can be satisfied.

In some embodiments, the plurality of first connection segments 31 are arranged in parallel. Such an arrangement manner is beneficial to avoid the intersection of the first connection segments 31. Moreover, it is also beneficial to ensure a uniform spacing between the adjacent first connection segments 31, facilitate technological production, and reduce a parasitic capacitance.

With continued reference to FIGS. 3 to 5, the connection lines 30 further include second connection segments 32, the second connection segments 32 connect two bit lines 21 positioned in different structural circuits 20a, and the different structural circuits 20a are arranged in the first direction X. For example, the two bit lines 21 connected to the second connection segments 32 are respectively positioned in the two structural cells 20 of the adjacent structural circuits 20a, and the two structural cells 20 are arranged opposite to each other. For example, the second connection segment 32 connects the second structural cell 202 of one structural circuit 20a and the first structural cell 201 of another structural circuit 20a. Such a connection manner is beneficial to shorten the length of the second connection segment 32, thereby reducing resistance of the second connection segment 32 and further reducing power consumption of the semiconductor structure.

In some embodiments, the sum of the serial numbers of the two bit lines 21 connected to the second connection segment 32 is N+1. That is, the connection manner of the second connection segments 32 is similar to the connection manner of the first connection segments 31, to prevent the connection segments from being intersected. In addition, connecting the bit lines 21 according to the corresponding relationship between the serial numbers is beneficial to standardize a positional relationship between the plurality of second connection segments 32, thereby shortening lengths of the second connection segments 32.

In some other embodiments, the sum of the serial numbers of the two bit lines 21 connected to the first connection segments 32 may not be N+1. Correspondingly, different second connection segments 32 may be arranged at different height positions to avoid the electrical connection between the second connection segments 32.

In some embodiments, the plurality of second connection segments 32 are arranged in parallel. Such an arrangement manner is beneficial to avoid intersection of the second connection segments 32. Moreover, it is beneficial to ensure a uniform spacing between the adjacent second connection segments 32, facilitate the technological production, and reduce the parasitic capacitance.

With continued reference to FIGS. 3 to 5, the connection lines 30 further include third connection segments 33. The third connection segments 33 connect two bit lines 21 positioned in different structural circuits 20a, and the different structural circuits 20a are arranged in the second direction Y. For example, the third connection segment 33 connects the bit lines 21 of two first structural cells 201 directly facing each other in the second direction Y. In some embodiments, the third connecting segment 33 connects the bit lines 21 of two second structural cells 202 directly facing each other in the second direction Y. In this way, it is beneficial to shorten the length of the third connection segment 33, thereby reducing the resistance of the third connection segment 33, and thus reducing the power consumption of the semiconductor structure. In some other embodiments, the third connection segment 33 may also connect one bit line 21 of the first structural cell 201 and one bit line 21 of the second structural cell 202.

In some embodiments, the sum of the serial numbers of the two bit lines 21 connected to the third connection segment 33 is N+1, or the serial numbers of the two bit lines 21 are the same. Thus, the third connection segments 33 are prevented from being intersected. In addition, connecting the bit lines 21 according to the corresponding relationship between the serial numbers is beneficial to standardize a positional relationship between the plurality of third connection segments 33, thereby shortening the lengths of the third connection segments 33.

In some embodiments, the plurality of third connection segments 33 are arranged in parallel. Such an arrangement manner is beneficial to avoid intersection of the third connection segments 33. Moreover, it is beneficial to ensure a uniform spacing between the adjacent third connection segments 33, facilitate the technological production, and reduce the parasitic capacitance.

For ease of understanding, descriptions will be made below by taking some examples.

In example I, referring to FIG. 3, the connection line 30 corresponding to each circuit group 20b has two third connection segments 33, where one of the two third connection segments 33 connects the bit lines 21 of the two first structural cells 201, other one of the two third connection segments 33 connects the bit lines 21 of the two second structural cells 202, and the two bit lines 21 connected to the third connection segment 33 have the same serial number. The connection line 30 corresponding to the two adjacent circuit groups 20b has one second connection segment 32.

For example, when the semiconductor structure has two circuit groups 20b in total, each connection line 30 has one second connection segment 32 and four third connection segments 33. That is, each connection line 30 has an "S" shape and connects the bit lines 21 of the plurality of structural cells 20 in sequence.

In example II, referring to FIG. 4, the connection line 30 corresponding to one of the plurality of circuit groups 20b has one third connection segment 33, and the sum of the serial numbers of the two bit lines 21 connected to the third connection segment 33 is N+1; and the connection lines 30 corresponding to the two adjacent circuit groups 20b have two second connection segments 32.

For example, when the semiconductor structure has four circuit groups 20b in total, each connection line 30 has one third connection segment 33 and six second connection segments 32. That is, the plurality of circuit groups 20b may be regarded as a memory region, and the connection lines 30 connect the bit lines 21 of the structural cells 20 around a circumferential direction of the memory region.

In example III, referring to FIG. 5, the connection line 30 corresponding to one of the plurality of circuit groups 20b has one third connection segment 33, and the two bit lines 21 connected to the third connection segment 33 have the same serial number; and the connection lines 30 corresponding to the two adjacent circuit groups 20b have two second connection segments 32.

For example, when the semiconductor structure has three circuit groups 20b in total, each connection line 30 has one third connection segment 33 and four second connection segments 32. That is, the plurality of circuit groups 20b may be regarded as the memory region, and the connection lines 30 connect the bit lines of the structural cells 20 around the circumferential direction of the memory region. Shapes of the connection lines 30 in the example II and the example III are substantially same, and a main difference lies in that the connection manners of the third connection segments 33 are different. The third connection segment 33 in the example II may be bent between the two structural cells 20, while the third connection segment 33 in the example III needs to be bent outside the two structural cells 20, so the total length of the third connection segment 33 in the example II is smaller.

In some other embodiments, the connection manners in the above three examples may also be combined. For example, when the structural cells 20 shown in FIG. 3 are combined with the structural cells 20 shown in FIG. 4, because the structural cells 20 arranged in an array in FIG. 3 and the structural cells arranged in an array in FIG. 4 are arranged in the second direction Y, only a group of third connection segments 33 needs to be added between the structural cells shown in FIG. 3 and the structural cells shown in FIG. 4, such that one connection line 30 may connect sixteen bit lines 21 in sixteen structural cells 20.

That is, the connection manners of the connection lines 30 may be adjusted and combined according to different semiconductor structures, to improve space utilization of the semiconductor structure.

Figure 6:
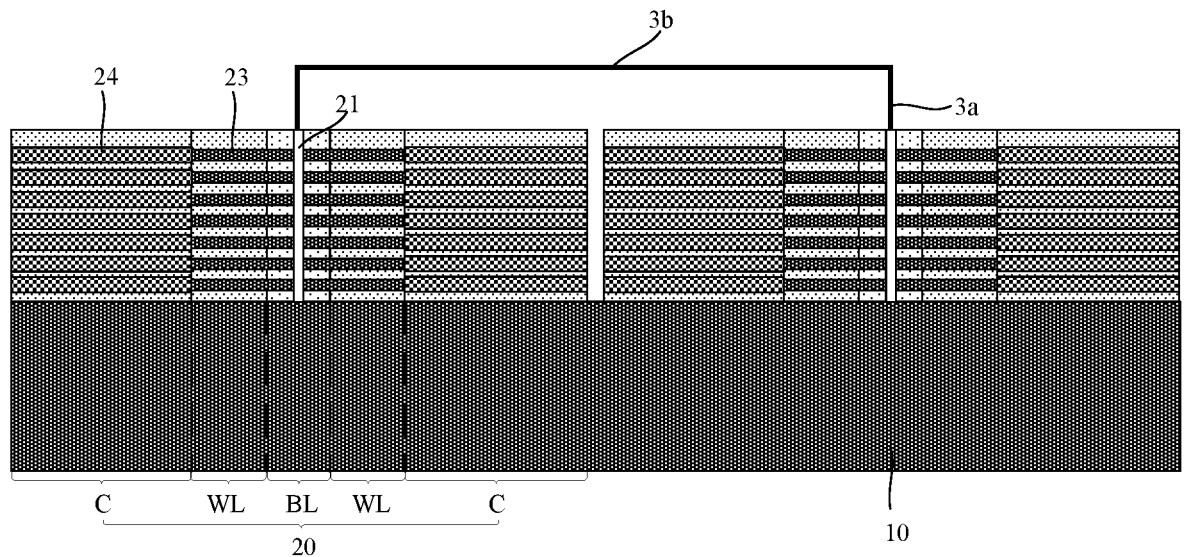
FIG. 6 and FIG. 7 respectively show two sectional views of the semiconductor structure provided by an embodiment of the present disclosure along a second direction.
Figure 7:
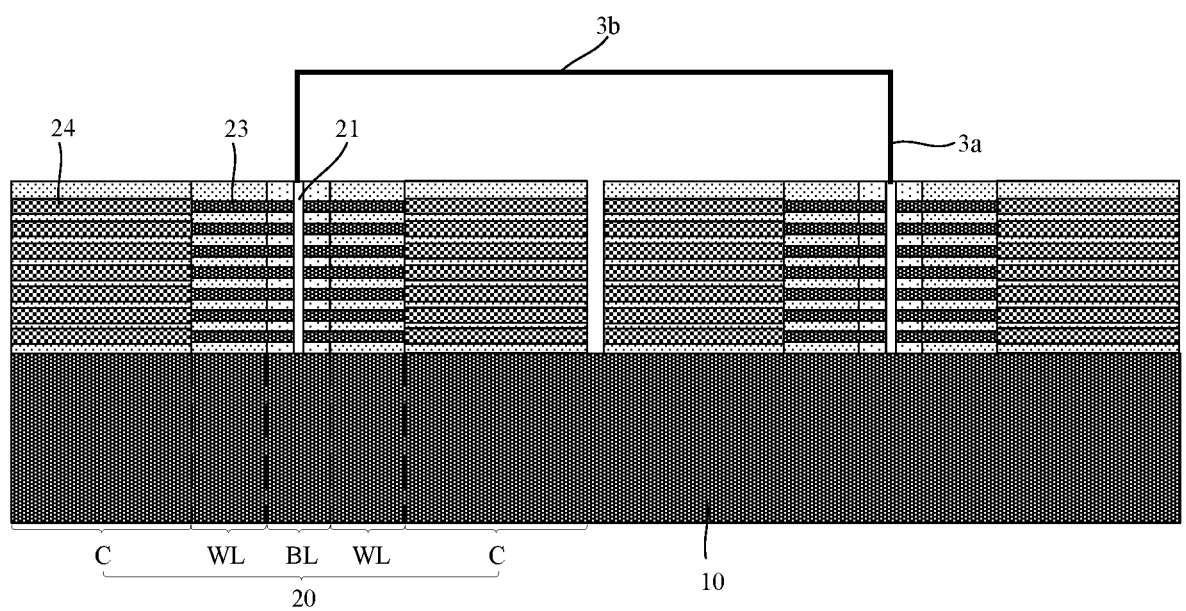

FIG. 6 and FIG. 7 respectively show two sectional views of the semiconductor structure along the second direction Y. Referring to FIG. 6 and FIG. 7, the connection lines 30 include vertical connection lines 3a and parallel connection lines 3b connected to each other. The vertical connection lines 3a are perpendicular to the surface of the substrate 10 and are connected to the bit lines 21, and the parallel connection lines 3b are parallel to the surface of the substrate 10. The vertical connection lines 3a are mainly configured to lead out the bit lines 21 to ensure that the parallel connection lines 3a can stride across the plurality of structural cells 20.

In some embodiments, adjacent two parallel connection lines 3b have different heights with respect to the surface of the substrate 10, and correspondingly, adjacent two vertical connection lines 3a have different lengths in the third direction Z. For example, the connection lines 30 in FIG. 6 and the connection lines 30 in FIG. 7 are arranged adjacent to each other, where the parallel connection lines 3b in FIG. 6 are lower in height than the parallel connection lines 3b in FIG. 7, and correspondingly, the vertical connection lines 3a in FIG. 6 are shorter than the vertical connection lines 3a in FIG. 7.

It is worth noting that the parasitic capacitance between the adjacent parallel connection lines 3b is related to a distance between the adjacent parallel connection lines and a directly facing area between the adjacent parallel connection lines; and the longer the distance is, the smaller the directly facing area is, and the smaller the parasitic capacitance is. When the adjacent parallel connection lines 3b have different heights, that is, when the adjacent parallel connection lines 3b are staggered from each other, the parasitic capacitance between the adjacent parallel connection lines 3b may be reduced, such that an operating speed of the semiconductor structure may be increased.

Figure 8:
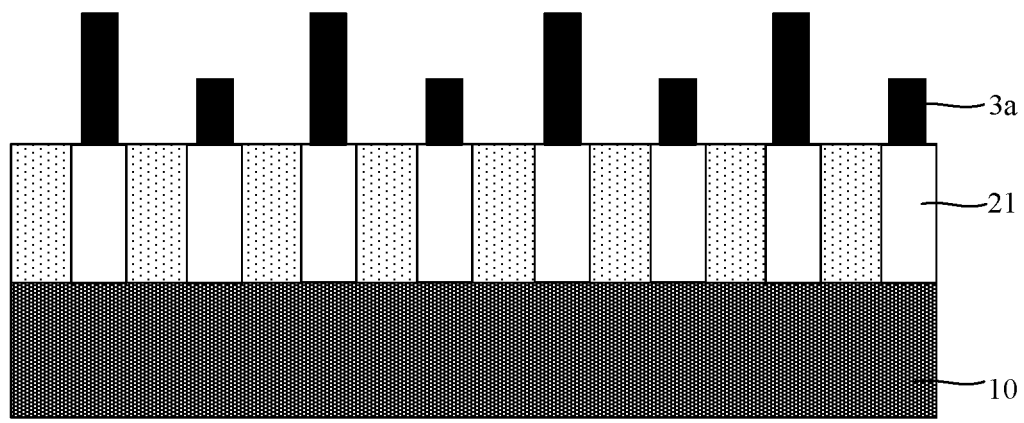
FIG. 8 and FIG. 9 respectively show two partial sectional views of the semiconductor structure provided by an embodiment of the present disclosure along a first direction.
Figure 9:
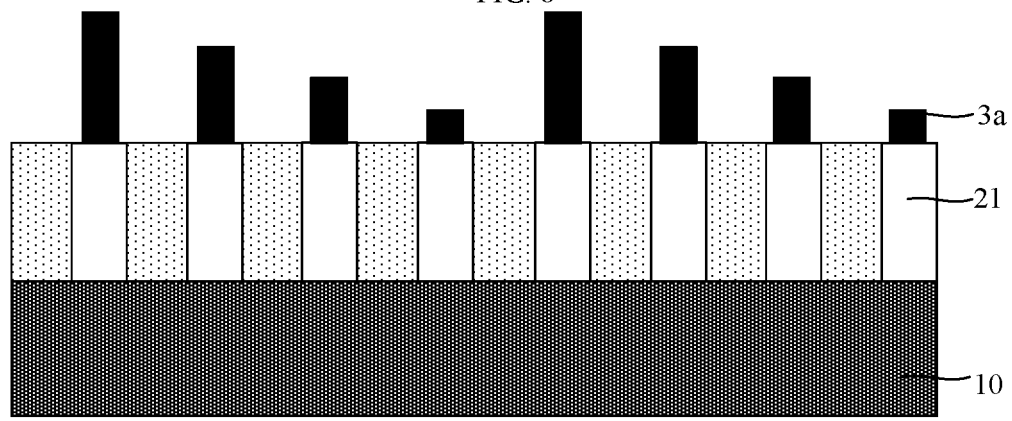

FIG. 8 and FIG. 9 respectively show two partial sectional views of the semiconductor structure along the first direction X. Referring to FIG. 8 and FIG. 9, in some embodiments, at least two parallel connection lines 3b are configured to constitute one parallel connection line group, and the parallel connection lines 3b in the parallel connection line group include first to $M^{th}$ parallel connection lines, where M is a positive integer greater than 1. The first to $M^{th}$ parallel connection lines have different heights, and the parallel connection lines 3b having the same serial number in different parallel connection line groups have the same height. For example, referring to FIG. 8, a group of parallel connection lines 3b include first to second parallel connection lines, where the first parallel connection line has a first height, the second parallel connection line has a second height, and the first height is greater than the second height. Referring to FIG. 9, a group of parallel connection lines 3b includes first to fourth parallel connection lines, where the first to fourth parallel connection lines respectively have first to fourth heights, and the first to fourth heights decrease sequentially.

It is worth noting that the embodiments of the present disclosure adopts serial numbers from 1 to M for the parallel connection lines 3b to facilitate understanding. However, the embodiments of the present disclosure do not limit numerical values of serial numbers of the parallel connection lines 3b, as long as corresponding positional relationships can be satisfied.

It should be noted that when the parallel connection lines 3b have different heights, a thickness of the semiconductor structure in the third direction Y may be increased, which is disadvantageous to miniaturization of the semiconductor structure, and may increase number of required photolithography masks. The connection lines 30 are grouped, and the connection lines 30 in different groups may have the same height, such that the parasitic capacitance 24 of the adjacent connection lines 30 may be reduced without causing greater impact on a thickness of the semiconductor structure, and the fabrication processes may be simplified.

In some embodiments, the parallel connection lines 3b in the parallel connection line group are arranged in sequence according to the serial numbers from 1 to M. For example, the parallel connection lines 3b in each parallel connection line group may be arranged in such a manner that heights increase or decrease progressively. Thus, the parallel connection lines 3b having the same serial number can have the same uniform distance, such that the manufacturing processes can be facilitated, and the parasitic capacitance can be reduced.

In some other embodiments, all the parallel connection lines 3b may also be at the same height position, so only one photomask is needed to form all the parallel connection lines 3b, and thus fabrication costs may be saved.

In conclusion, the bit lines 21 of different structural cells 20 may be connected to the same connection line 30, and the plurality of bit lines 21 connected to the same connection line 30 may be regarded as the same bit line 21. Therefore, the number of the transistors 23 and the capacitors connected to one bit line 21 is increased. In addition, because the plurality of bit lines 21 may be led out via the same connection line 30, the number of the connection lines 30 is reduced, in this way, difficulty of connecting the connection lines 30 to the peripheral circuit can be reduced, and internal space of the semiconductor structure can be fully utilized.

Although the embodiments of the present disclosure have been shown and described above, it is to be understood that the above-mentioned embodiments are exemplary and should not be construed as limiting the present disclosure. Those of ordinary skill in the art may make changes, modifications, replacements and variations to the above embodiments without departing from the scope of the present disclosure. Therefore, all changes or embellishments made according to the claims and the specification of the present disclosure shall still fall within the scope covered by the patent of the present disclosure.

What is claimed is:

1. A semiconductor structure, comprising:
   a substrate, structural cells arranged in an array being provided on the substrate;
   each one of the structural cells comprising a transistor region and a capacitor region arranged in a second direction;
   the transistor region has a plurality of transistors and the capacitor region has a plurality of capacitors, wherein the plurality of capacitors and the plurality of transistors are arranged in one to one correspondence;
   each one of the structural cells comprising a plurality of transistor groups arranged in a first direction, the plurality of transistor groups comprising multi-layer transistors extending in the second direction, the first direction being perpendicular to the second direction, and the first direction and the second direction being parallel to a surface of the substrate;
   each one of the structural cells further comprising a plurality of bit lines extending in a third direction, the plurality of bit lines being electrically connected to the multi-layer transistors in the same one of the plurality of transistor groups, and the third direction being perpendicular to the surface of the substrate; and
   a plurality of connection lines, the plurality of connection lines being connected to the plurality of bit lines in each one of the structural cells in one-to-one correspondence, and one of the plurality of bit lines in one of the structural cells is connected with one of the plurality of bit lines in another one of the structural cells through one of the plurality of connection lines.

2. The semiconductor structure according to claim 1, wherein
   adjacent two of the structural cells arranged in the first direction are configured to constitute a structural circuit;
   the plurality of bit lines of the same structural cell comprise first to $N^{th}$ bit lines sequentially arranged in the first direction, N being a positive integer greater than 1; and
   the plurality of connection lines comprises first connection segments connected to two of the plurality of bit lines, the two bit lines being respectively positioned in the two structural cells of the same structural circuit, and sum of serial numbers of the two bit lines being N+1.

3. The semiconductor structure according to claim 2, wherein
   the plurality of connection lines further comprises second connection segments and third connection segments;
   the second connection segments connect two of the plurality of bit lines positioned in different structural circuits, the different structural circuits being arranged in the first direction, and sum of serial numbers of the two bit lines connected to the second connection segments being N+1; and
   the third connection segments connect two of the plurality of bit lines positioned in the different structural circuits, the different structural circuits being arranged in the second direction, sum of serial numbers of the two bit lines connected to the third connection segments being N+1, or the serial numbers of the two bit lines being same.

4. The semiconductor structure according to claim 3, wherein
   the two bit lines connected to the second connection segments are respectively positioned in the two structural cells of the adjacent structural circuits, the two structural cells being arranged oppositely;
   two of the structural circuits arranged in the second direction constitute a circuit group, a plurality of circuit groups being arranged in the first direction;
   the two structural cells of the same structural circuit are respectively named as a first structural cell and a second structural cell, the two first structural cells in the circuit group directly facing each other, and the two second structural cells in the circuit group directly facing each other; and the third connection segments connect the two bit lines of the two first structural cells directly facing each other, or the third connection segments connect the two bit lines of the two second structural cells directly facing each other.

5. The semiconductor structure according to claim 4, wherein the plurality of connection lines corresponding to each of the plurality of circuit groups have two third connection segments, one of the two third connection segments being configured to connect the two bit lines of each of the two first structural cells, other one of the two third connection segments being configured to connect the two bit lines of each of the two second structural cells, and the two bit lines connected to each of the two third connection segments having the same serial number; and the plurality of connection lines corresponding to adjacent two of the plurality of circuit groups have one of the second connection segments.

6. The semiconductor structure according to claim 4, wherein the plurality of connection lines corresponding to one of the plurality of circuit groups have one of the third connection segments, the sum of the serial numbers of the two bit lines connected to the third connection segment being N+1; and the plurality of connection lines corresponding to adjacent two of the plurality of circuit groups have two of the second connection segments.

7. The semiconductor structure according to claim 4, wherein the plurality of connection lines corresponding to one of the plurality of circuit groups has one of the third connection segments, the two bit lines connected to the third connection segment having the same serial number; and the plurality of connection lines corresponding to adjacent two of the plurality of circuit groups have two of the second connection segments.

8. The semiconductor structure according to claim 2, wherein the plurality of first connection segments are arranged in parallel.

9. The semiconductor structure according to claim 3, wherein the plurality of second connection segments are arranged in parallel.

10. The semiconductor structure according to claim 3, wherein the plurality of third connection segments are arranged in parallel.

11. The semiconductor structure according to claim 1, wherein the plurality of connection lines comprise vertical connection lines and parallel connection lines connected to each other, the vertical connection lines being perpendicular to the surface of the substrate and being connected to the plurality of bit lines, and the parallel connection lines being parallel to the surface of the substrate.

12. The semiconductor structure according to claim 11, wherein adjacent two of the parallel connection lines have different heights with respect to the surface of the substrate.

13. The semiconductor structure according to claim 12, wherein at least two of the parallel connection lines are configured to constitute a parallel connection line group, the parallel connection lines in the parallel connection line group comprising first to $M^{th}$ parallel connection lines, and M being a positive integer greater than 1; and the first to $M^{th}$ parallel connection lines have different heights, the parallel connection lines with the same serial number in the different parallel connection line groups having a same height.

14. The semiconductor structure according to claim 13, wherein the parallel connection lines in the parallel connection line group are arranged in sequence according to serial numbers from 1 to M.

15. The semiconductor structure according to claim 1, wherein there are two transistors in a layer of the plurality of transistor groups.

* * * * *